(12) United States Patent
Kagawa et al.

(10) Patent No.: US 11,183,810 B2
(45) Date of Patent: Nov. 23, 2021

(54) LIGHT SOURCE MODULE AND LIGHT SOURCE DEVICE INCLUDING THE SAME

(71) Applicant: SHARP KABUSHIKI KAISHA, Sakai (JP)

(72) Inventors: Toshio Kagawa, Sakai (JP); Noriaki Fujii, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 39 days.

(21) Appl. No.: 16/711,445

(22) Filed: Dec. 12, 2019

(65) Prior Publication Data
US 2020/0194967 A1   Jun. 18, 2020

Related U.S. Application Data

(60) Provisional application No. 62/781,352, filed on Dec. 18, 2018.

(51) Int. Cl.
*H01S 5/02* (2006.01)
*H01S 5/02253* (2021.01)
*H01S 5/02326* (2021.01)
*H01S 5/00* (2006.01)

(52) U.S. Cl.
CPC ............... *H01S 5/02* (2013.01); *H01S 5/005* (2013.01); *H01S 5/02253* (2021.01); *H01S 5/02326* (2021.01)

(58) Field of Classification Search
CPC .. H01S 5/02253; H01S 5/02326; H01S 5/005; H01S 5/0087; H01S 5/02212
See application file for complete search history.

(56) References Cited

U.S. PATENT DOCUMENTS

| | | | | |
|---|---|---|---|---|
| 5,615,052 | A * | 3/1997 | Doggett | G02B 7/02 359/811 |
| 7,345,832 | B2 * | 3/2008 | Shibuya | G02B 6/4204 359/811 |
| 2016/0073071 | A1 * | 3/2016 | Nagashima | G02B 27/0101 353/121 |
| 2018/0166851 | A1 * | 6/2018 | Kijima | H01S 5/023 |

FOREIGN PATENT DOCUMENTS

| JP | 2003-067965 A | 3/2003 |
|---|---|---|
| JP | 2012-248236 A | 12/2012 |

* cited by examiner

*Primary Examiner* — Michael Carter
(74) *Attorney, Agent, or Firm* — ScienBiziP, P.C.

(57) ABSTRACT

In a light source module A, a lens shapes emitted light 1a of a semiconductor laser. A plate on which the lens is disposed has a through hole through which the emitted light of the semiconductor laser passes and an adjustment surface that is used for adjusting the position of the lens with respect to the through hole in a direction perpendicular to the optical axis L of the semiconductor laser. An end surface 5b of the lens that is opposite to an optical light-emitting surface of the lens is fixed to the adjustment surface with an adhesive AD. A stepped portion that is recessed in the direction of the optical axis L is formed in a bonding portion in which the end surface of the lens and the adjustment surface are bonded together.

9 Claims, 8 Drawing Sheets

LIGHT SOURCE MODULE AND LIGHT SOURCE DEVICE INCLUDING THE SAME

TECHNICAL FIELD

The present invention relates to improvement of a light source module that uses a semiconductor laser as a light source and improvement of a light source device that includes the light source module.

BACKGROUND ART

In the related art, a light source module that uses a semiconductor laser as a light source includes a lens that performs beam shaping so as to shape divergent light emitted from the semiconductor laser into, for example, substantially collimated light, and a lens holder that has a through hole through which the divergent light from the semiconductor laser passes. The lens is fixed to an end surface of the lens holder with an adhesive so as to be located at a position where the optical axis of the lens coincides with the center line of the through hole of the lens holder or so as to be located at a position where the lens has a desired optical axis. In addition, in a state where the lens holder is positioned in such a manner that the optical axis of the lens and the center line of the through hole of the lens holder coincide with the optical axis of the semiconductor laser, for example, a lower end portion (or a side end portion) of the lens holder is fixed to a housing or the like with an adhesive made of a resin or the like.

However, in the light source module having the above configuration, even if the lens holder is fixed to the housing or the like with the adhesive in a state where the optical axis of the lens and the center line of the through hole of the lens holder coincide with the optical axis of the semiconductor laser, when the lower end portion (or the side end portion) of the lens holder and the housing or the like are bonded together in a state where the adhesive is present in a space formed therebetween, the lens holder will be displaced in the vertical direction (or in the transverse direction) if thermal deformation, such as thermal expansion or thermal contraction, of the resin of the adhesive that is present in this space occurs. As a result, there is a disadvantage in that the optical axis of the lens is displaced in the vertical direction (or the transverse direction) with respect to the optical axis of the semiconductor laser, so that the lens becomes decentered, resulting in deterioration in the accuracy of the optical axis of a shaped beam.

In the related art, the configurations described in PTL 1 and PTL 2 are examples of a technology for improving the accuracy of the position of a lens in a light source module that includes the lens. In the configuration described in PTL 1, the left and right end portions of a lens holder to which an objective lens is fixed are fixed, with an adhesive, to two columnar portions that are arranged on a substrate so as to face the left and right end portions, and their surfaces to which the adhesive is applied are arranged so as to be parallel to one another and so as to be inclined with respect to the optical axis of the objective lens. This makes a state, such as volume shrinkage or volume relaxation, of the adhesive uniform, so that a force that acts on portions to which the adhesive is applied is made uniform. In the configuration described in PTL 2, an end edge portion of a lens and a stepped portion of a lens holder are bonded and fixed to each other with an adhesive.

CITATION LIST

Patent Literature

[PTL 1] Japanese Unexamined Patent Application Publication No. 2012-248236

[PTL 2] Japanese Unexamined Patent Application Publication No. 2003-67965

SUMMARY OF INVENTION

Technical Problem

The inventors of the present invention have designed the following configuration as a configuration that is different from both the configurations for improving the accuracy of the position of a lens, which are described in PTL 1 and PTL 2. In the light source module that uses a semiconductor laser as a light source, a plate that serves as a lens holder has an adjustment surface oriented in a direction perpendicular to the optical axis of the semiconductor laser, and the position of a lens is adjusted along the adjustment surface (within the adjustment surface) in a state where an adhesive is applied to the adjustment surface or the rear surface of the lens (a surface that is opposite to an optical light-emitting surface) such that the optical axis of the lens is adjusted so as to coincide with the optical axis of the semiconductor laser or so as to become a desired optical axis. In a state where the lens is located at the adjusted position, the applied adhesive is cured so as to fix the lens onto the adjustment surface.

However, with this configuration, there is a concern that, during the positional adjustment of the lens, a portion of the applied adhesive may move along with the positional adjustment of the lens and may enter a through hole of the plate and the effective aperture of the lens. In this case, the entered adhesive causes distortion or missing portions in the shape of a beam that has been shaped, which in turn results in deterioration in the quality of the beam.

It is an object of the present invention to achieve improvement of beam quality by suppressing, in a light source module that uses a semiconductor laser as a light source, an adhesive used for bonding a lens from entering a through hole and the effective aperture of the lens while the position of the lens is adjustable along an adjustment surface in a direction perpendicular to the optical axis of the semiconductor laser as mentioned above.

Solution to Problem

A light source module according to the present invention includes a semiconductor laser, a lens that shapes emitted light of the semiconductor laser, and a plate on which the lens is disposed. The plate has a through hole through which the emitted light of the semiconductor laser passes and an adjustment surface that is used for adjusting a position of the lens with respect to the through hole in a direction perpendicular to an optical axis of the semiconductor laser. An end surface of the lens that is opposite to an optical light-emitting surface of the lens is fixed to the adjustment surface of the plate with an adhesive. A stepped portion that is recessed in a direction of the optical axis of the semiconductor laser is formed in a bonding portion in which the end surface of the lens and the adjustment surface are bonded together.

Advantageous Effects of Invention

According to the present invention, the position of a lens with respect to a through hole (or the optical axis of a semiconductor laser) is adjusted along an adjustment surface of a plate before the lens is fixed onto the adjustment surface of the plate with an adhesive, so that the optical axis of the lens can coincide with the optical axis of the semiconductor laser, and thus, improvement in the accuracy of the position of emitted light that has undergone beam shaping can be achieved.

Although, during positional adjustment of the lens, a portion of the adhesive that is present in a bonding portion in which the end surface of the lens that is opposite to an optical light-emitting surface of the lens and the adjustment surface of the plate are bonded together moves along with the positional adjustment of the lens, a stepped portion is formed in the bonding portion, and the moving portion of the adhesive enters the stepped portion, so that the portion of the adhesive is suppressed from reaching a through hole of the plate or entering the effective aperture of the lens. Therefore, distortion of the emitted light, which has undergone beam shaping, due to the adhesive is suppressed, and a high quality of a light beam can be ensured.

DESCRIPTION OF EMBODIMENTS

Embodiments of the present invention will be described below with reference to the drawings.

First Embodiment

Figure 1:
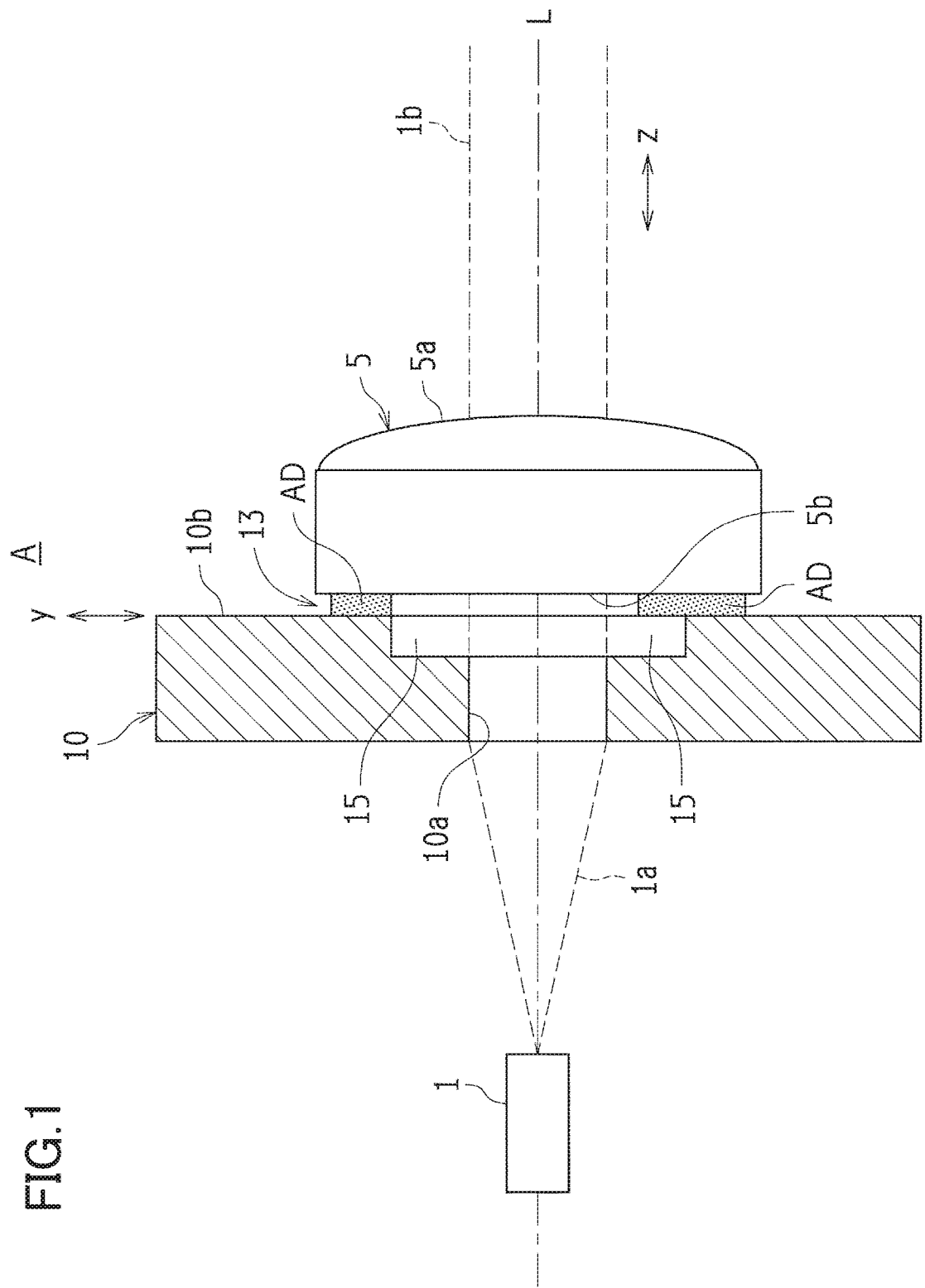
FIG. 1 is a sectional side view illustrating a schematic configuration of a light source module according to a first embodiment.
Figure 2:
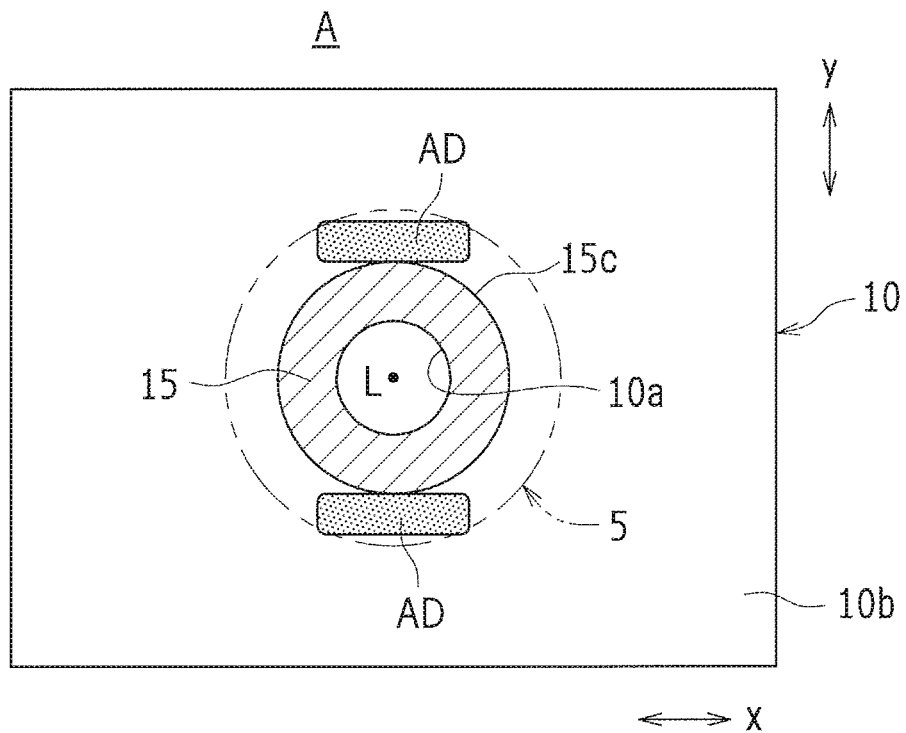
FIG. 2 is a diagram illustrating the light source module when viewed in the optical axis direction of a semiconductor laser.

FIG. 1 is a sectional side view illustrating a schematic configuration of a light source module according to the first embodiment. FIG. 2 is a diagram illustrating the light source module when viewed in a direction opposite to the direction in which a laser beam is emitted. In FIG. 1 and FIG. 2, a reference sign 1 denotes a semiconductor laser that serves as a light source, and the semiconductor laser 1 emits divergent light 1a centered on an optical axis L of the semiconductor laser 1. The cross section of the emitted light (divergent light) 1a of the semiconductor laser 1 has a circular shape centered on the optical axis L. A reference sign 5 denotes a convex lens that shapes the divergent light 1a of the semiconductor laser 1, and the convex lens 5 has an optical light-emitting surface 5a that is formed in a curved shape on one end side thereof and a flat surface 5b that is formed on the other end side thereof. A reference sign 10 denotes a plate on which the convex lens 5 is disposed. The convex lens 5 is disposed on the side of the plate that is opposite to the side of the plate 10 on which the semiconductor laser 1 is disposed.

The plate 10 is disposed in an upright position in the vertical direction in FIG. 1. Although not illustrated, a lower end portion of the plate 10 is fixed to a housing that extends in the horizontal direction with an adhesive made of a resin. Specifically, the lower end surface of the plate 10 and a horizontal surface of the housing are bonded together with the adhesive while they are in close contact with each other. In other words, the lower end surface of the plate 10 and the horizontal surface of the housing are bonded together with no gap formed therebetween. Note that, instead of employing the configuration in which the lower end portion of the plate 10 is fixed in place, a side end portion of the plate 10 may be fixed, with the adhesive, onto a housing that extends in the vertical direction. Also in this case, the side end surface of the plate 10 and a vertical surface of the housing are bonded together with the adhesive while they are in close contact with each other. Alternatively, the plate may be formed integrally with a housing.

A center portion of the plate 10 in the vertical direction has a through hole 10a extending through the plate 10 in a thickness direction of the plate 10 (in the transverse direction in FIG. 1). The convex lens 5 shapes the divergent light 1a that has been emitted from the semiconductor laser 1 and that has passed through the through hole 10a into emitted light 1b that is approximately parallel to the optical axis L of the semiconductor laser. The through hole 10a has a circular shape when viewed in cross section so as to fit the cross-sectional shape of the divergent light 1a as illustrated in FIG. 2.

In the plate 10, an end surface on the right-hand side in FIG. 1, that is, an end surface 10b facing the convex lens 5, is formed in a plane that is perpendicular to the optical axis L of the semiconductor laser as also illustrated in FIG. 2. As will be described in detail later, the flat surface 10b of the plate 10 and the flat surface 5b of the convex lens 5 are bonded together with an adhesive AD, so that the convex lens 5 is fixed to the plate 10. In FIG. 1 and FIG. 2, as an example, the adhesive AD is applied to portions of the flat surface 10b of the plate 10, the portions respectively corresponding to the periphery of an upper end portion of the convex lens 5 and the periphery of a lower end portion of the convex lens 5, and the peripheries of the upper and lower end portions of the flat surface 5b of the convex lens 5 are bonded to the flat surface 10b of the plate 10 with the adhesive AD. Note that these application positions of the adhesive AD are examples, and the adhesive AD may be applied to other portions of the flat surface 10b of the plate 10. That is to say, it is only necessary for the adhesive AD to be interposed between the outer periphery of the through hole 10a in the flat surface 10b of the plate 10 and the flat surface 5b of the convex lens 5. Thus, a portion in which the flat surface 10b of the plate 10 and the flat surface 5b of the convex lens 5 face each other corresponds to a bonding portion 13 where the flat surface 10b and the flat surface 5b are bonded together with the adhesive AD.

In a state where the lower end portion (or the side end portion) of the plate 10 is bonded and fixed to the housing with no gap formed therebetween as described above, when the convex lens 5 is disposed on the flat surface 10b of the plate 10 while the optical axis of the convex lens 5 coincides with the center line of the through hole 10a of the plate 10, there is a case where the optical axis of the convex lens 5 may not coincide with the optical axis L of the semiconductor laser 1 and where the convex lens 5 may be decentered. Thus, it is necessary to adjust the position of the convex lens 5 on the flat surface 10b of the plate 10 with respect to the through hole 10a of the plate 10 in such a manner that the optical axis of the convex lens 5 coincides with the optical axis L of the semiconductor laser 1. The flat surface 10b of the plate 10 serves as an adjustment surface that is used for adjusting the position of the convex lens 5 in such a manner that the optical axis of the convex lens 5 coincides with the optical axis L of the semiconductor laser 1.

To describe positional adjustment of the convex lens 5 specifically, on the flat surface (adjustment surface) 10b of the plate 10, which is a plane defined by two axes (the x-axis and the y-axis) that are perpendicular to each other, the position of the convex lens 5 is finely adjusted along the adjustment surface 10b in the x-axis direction illustrated in FIG. 2 and the y-axis direction illustrated in FIG. 1 and FIG. 2 in such a manner as to adjust the positions of the convex lens 5 with respect to the two perpendicular axes, that is, the position of the convex lens 5 in the transverse direction in FIG. 2 (the x-axis direction and the direction perpendicular to FIG. 1) that is perpendicular to the direction of the emitted light (collimated light) 1b shaped by the convex lens 5, or the direction of the optical axis L of the semiconductor laser (the transverse direction in FIG. 1 and the z-axis direction illustrated in FIG. 1) and the position of the convex lens 5 in the vertical direction (the y-axis direction). As a result, the optical axis of the convex lens 5 can coincide with the optical axis L of the semiconductor laser.

Then, in a state where the position of the convex lens 5 in the x-axis direction and the position of the convex lens 5 in the y-axis direction have been adjusted by using the adjustment surface 10b of the plate 10, the convex lens 5 is fixed onto the adjustment surface 10b of the plate 10 with the adhesive AD. Note that FIG. 1 and FIG. 2 each illustrate a state where both the center line of the through hole 10a of the plate 10 and the optical axis of the convex lens 5 coincide with the optical axis L of the semiconductor laser 1.

In the bonding portion 13, a stepped portion 15 is formed in the plate 10, and the stepped portion 15 is recessed from the adjustment surface 10b in the optical axis L of the semiconductor laser 1 (the z-axis direction). The stepped portion 15 is formed in the shape of a recess having a quadrangular shape when viewed in cross section by cutting out the adjustment surface 10b to the side on which the semiconductor laser 1 is disposed, and as illustrated in FIG. 2, the stepped portion 15 is formed in a hollow circular shape surrounding the outer periphery of the through hole 10a of the plate 10 when viewed in the direction of the optical axis L of the semiconductor laser 1. The center of the circular shape coincides with the center of the through hole 10a. The stepped portion 15 having a hollow circular shape is illustrated by hatching in FIG. 2. The inner peripheral edge of the stepped portion 15 corresponds to the outer peripheral edge of the through hole 10a having a circular shape, and an outer peripheral edge 15c of the stepped portion 15 is spaced apart from the outer peripheral edge of the convex lens 5 by a predetermined distance in such a manner that the plate 10 and the convex lens 5 are reliably bonded together with the adhesive AD.

In the present embodiment, in a case where the semiconductor laser 1 is positioned at a predetermined level, the lower end portion (or the side end portion) of the plate 10 is brought into close contact with, for example, a horizontal surface (or a vertical surface) of a housing (not illustrated) while the plate 10 is in an upright position, and the lower end portion (or the side end portion) of the plate 10 and the horizontal surface (or the vertical surface) of the housing are bonded and fixed to each other with no gap formed therebetween with an adhesive made of a resin. In a state where the plate 10 is fixed to the housing in this manner, there is a case where the center line of the through hole 10a of the plate 10 may not exactly coincide with the optical axis L of the semiconductor laser 1 and may shift in the y-axis direction (or the x-axis direction). In this case, it is necessary to adjust the position of the convex lens 5 on the plate 10 with respect to the through hole 10a in the y-axis direction (or the x-axis direction) in such a manner that the optical axis of the convex lens 5 exactly coincides with the optical axis L of the semiconductor laser 1.

More specifically, positional adjustment of the convex lens 5 is performed as follows. Since the adjustment surface 10b of the plate 10 is a plane defined by the x-axis and the y-axis, which are perpendicular to the direction of the optical axis L of the semiconductor laser 1 (the z-axis direction), the positional adjustment of the convex lens 5 is performed by finely adjusting the position of the convex lens 5 in the x-axis direction and the y-axis direction on the adjustment surface 10b in a state where the adhesive AD is interposed between the adjustment surface 10b and the flat surface 5b of the convex lens 5 in such a manner that the optical axis of the convex lens 5 exactly coincides with the optical axis L of the semiconductor laser 1. Then, in a state after the positional adjustment has been performed, the flat surface 5b of the convex lens 5 is fixed to the adjustment surface 10b of the plate 10 with the adhesive AD.

In this case, a portion of the adhesive may sometimes move toward the through hole 10a of the plate 10 as the position of the convex lens 5 is adjusted in the y-axis direction (or in the x-axis direction). However, since the stepped portion 15 that is recessed toward the plate 10 is formed in the bonding portion 13, and the stepped portion 15 is located on the outer periphery side of the through hole 10a, the portion of the adhesive AD escapes into the stepped portion 15 and is effectively suppressed from reaching the through hole 10a.

Accordingly, in the present embodiment, since the position of the convex lens 5 in the y-axis direction (or in the x-axis direction) can be adjusted on the adjustment surface 10b of the plate 10, the optical axis of the convex lens 5 can accurately coincide with the optical axis L of the semiconductor laser 1, and improvement in the accuracy of the position of the emitted light 1b that has been shaped by the convex lens 5 can be achieved.

In addition, when the position of the convex lens 5 is adjusted on the adjustment surface 10b of the plate 10, a portion of the adhesive AD escapes into the stepped portion 15, so that the portion of the adhesive AD can be reliably prevented from entering the through hole 10a of the plate 10 or the area of the effective aperture of the convex lens 5. Therefore, the beam shape of the emitted light 1b that has been shaped by the convex lens 5 can be ensured as is expected, and improvement of beam quality can be achieved.

Furthermore, since the stepped portion 15, which is formed in the bonding portion 13, is located on the outer periphery side of the through hole 10a of the plate 10, a portion of the adhesive AD that moves along with the positional adjustment of the convex lens 5 can be caused to escape into the stepped portion 15 with certainty.

(Modification of Stepped Portion)

Figure 3:
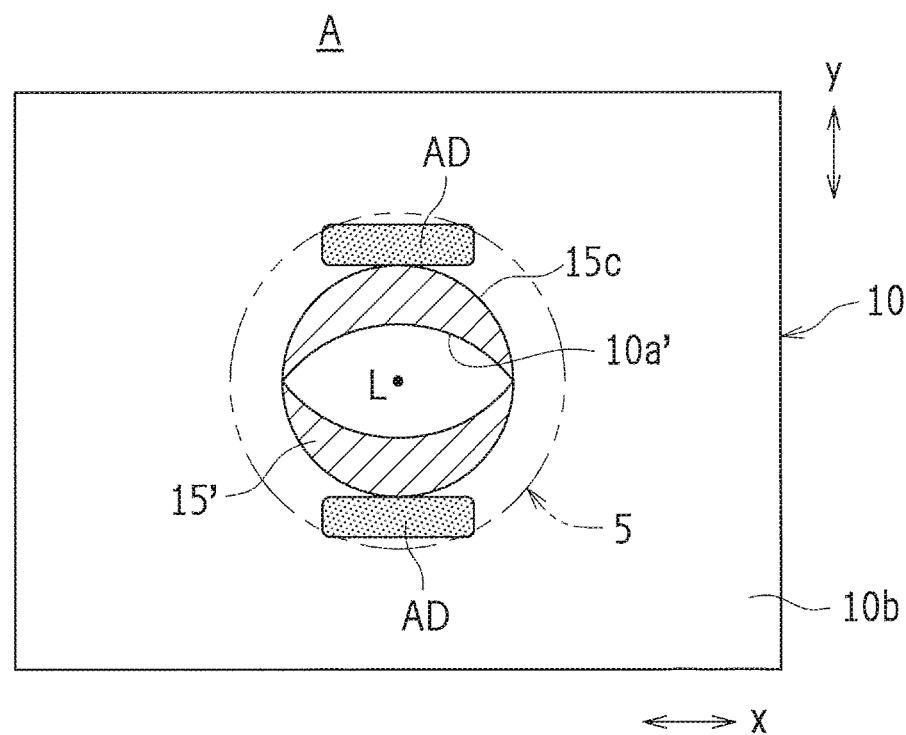
FIG. 3 is a diagram illustrating a modification of a stepped portion included in the light source module and illustrating the light source module when viewed in the optical axis direction of the semiconductor laser.

FIG. 3 is a diagram illustrating a modification of the stepped portion 15 that is included in a light source module A and illustrating the light source module A when viewed in the direction of the optical axis L of the semiconductor laser.

In the present modification, in the case where the divergent light 1a from the semiconductor laser 1 has an elliptical shape that is long in the transverse direction (in the x-axis direction), a through hole 10a' of the plate 10 is also formed in an elliptical shape that is long in the transverse direction so as to correspond to the elliptical shape of the divergent light 1a.

As the through hole 10a' has the elliptical shape, a stepped portion 15' of the plate 10 that is formed in the bonding portion 13 is formed in such a manner as to surround the through hole 10a' having the elliptical shape, and the shape of the stepped portion 15' is a shape formed of two crescentic shapes that are point-symmetric about the center line of the through hole 10a' in the vertical direction as illustrated by hatching in FIG. 3.

In the present modification, as the movable range of the convex lens 5 is wider in the y-axis direction than in the x-axis direction when the position of the convex lens 5 is adjusted, the stepped portion 15' is formed to be wide in the y-axis direction, and thus, even in the case where the position of the convex lens 5 is adjusted to a large extent in the y-axis direction, a portion of the adhesive AD that moves along with the positional adjustment of the convex lens 5 can be caused to escape into the stepped portion 15' with certainty.

Note that, in the present modification, although the divergent light 1a from the semiconductor laser 1 and the through hole 10a each have an elliptical shape that is long in the x-axis direction, in the case where they each have an elliptical shape that is long in the y-axis direction, the shape of the stepped portion 15' may be a shape formed of two crescentic shapes that are point-symmetrical in the x-axis direction. In addition, the shape of the divergent light 1a and the shape of the through hole 10a are not limited to a circular shape and an elliptical shape, and even if the shape of the divergent light 1a and the shape of the through hole 10a are various other shapes, the shape of the stepped portion can be changed in accordance with their shapes.

Second Embodiment

Figure 4:
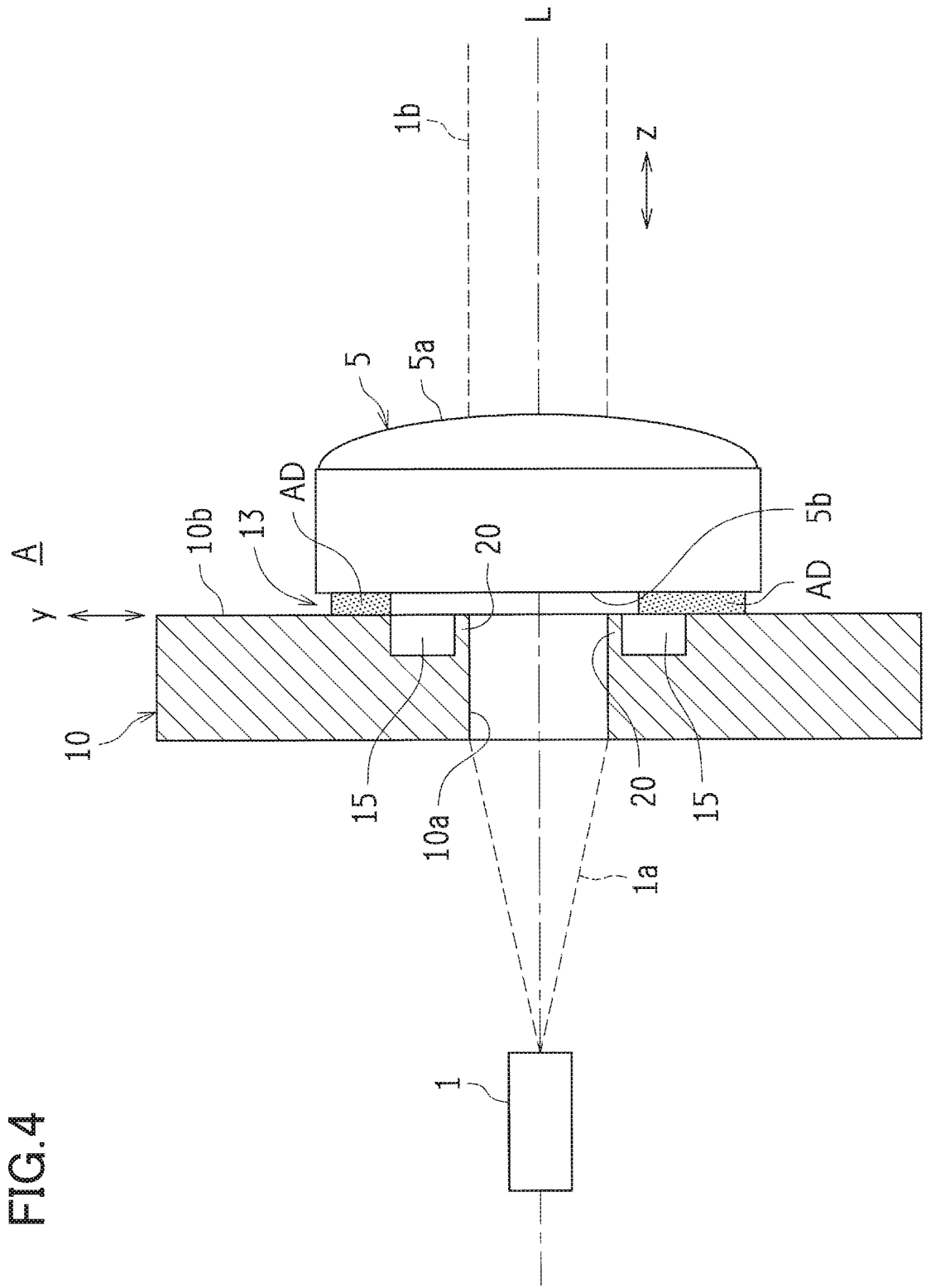
FIG. 4 is a sectional side view illustrating a schematic configuration of a light source module according to a second embodiment.

The second embodiment will now be described. FIG. 4 is a sectional side view illustrating a schematic configuration of the light source module A according to the second embodiment.

In FIG. 4, a wall portion 20 that has a protruding shape and extends in the direction of the optical axis L of the semiconductor laser 1 (in the x-axis direction) is formed at an end of the stepped portion 15 included in the plate 10, the end of the stepped portion 15 being located on the side on which the through hole 10a is present. As seen from FIG. 4, the wall portion 20 is a wall that partitions the stepped portion 15 and the through hole 10a of the plate 10 from each other and is located at the outer peripheral edge of the through hole 10a. The wall portion 20 has a hollow circular shape that surrounds the outer periphery of the through hole 10a when viewed in the z-axis direction, and the cross section of the wall portion 20 has a flat plate-like shape having a uniform thickness (a uniform length in the y-axis direction). In addition, an end surface of the wall portion 20 forms the same plane as the adjustment surface 10b of the plate 10.

In the present embodiment, when the position of the convex lens 5 with respect to the through hole 10a of the plate 10 is adjusted in the y-axis direction (or in the x-axis direction), in the case where a portion of the adhesive AD escapes into the stepped portion 15 of the plate 10, even if the adhesive AD in the stepped portion 15 tries to flow into the through hole 10a of the plate 10, since the wall portion 20 is positioned between the stepped portion 15 and the through hole 10a, the wall portion 20 hinders the adhesive AD from flowing into the through hole 10a.

Consequently, the adhesive AD that has escaped in the stepped portion 15 can stay in the stepped portion 15. Therefore, a portion of the adhesive AD can be prevented, with higher certainty, from entering the through hole 10a of the plate 10 or the area of the lens effective aperture of the convex lens 5, and the beam shape of the emitted light 1b that has been shaped by the convex lens 5 can be ensured as is expected.

In addition, since the wall portion 20 is a wall that partitions the stepped portion 15 and the through hole 10a of the plate 10 from each other and is located at the outer peripheral edge of the through hole 10a, even if a portion of the adhesive AD that has escaped in the stepped portion 15 moves to the vicinity of the through hole 10a, the wall portion 20 can reliably suppress the portion of the adhesive AD from flowing into the through hole 10a.

(Modification of Wall Portion)

Figure 5:
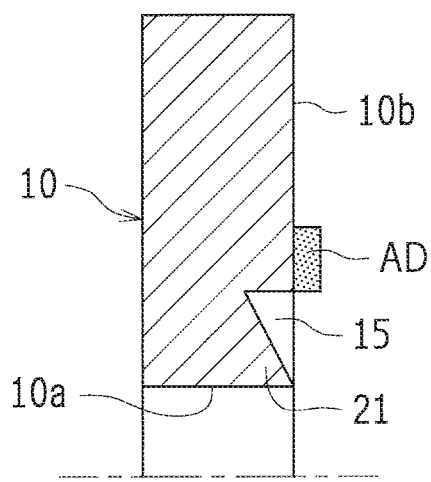
FIG. 5 is a sectional view of the peripheral portion of a plate and illustrates a modification of a wall portion included in the light source module.

FIG. 5 is a sectional view of the upper peripheral portion of the through hole 10a of the plate 10 and illustrates a modification of the wall portion 20.

In FIG. 5, an oblique wall portion 21 that is inclined toward the adjustment surface 10b of the plate 10 in a direction from the bottom of the outer peripheral end surface of the stepped portion 15 toward the through hole 10a is formed in the stepped portion 15. The height (the length in the z-axis direction) of a portion of the wall portion 21, the portion being located at the outer peripheral edge of the through hole 10a, reaches the adjustment surface 10b of the plate 10. The cross-sectional shape of the stepped portion 15 is a triangular shape because of the oblique wall portion 21.

In the present modification, when the position of the convex lens 5 is adjusted, even if a portion of the adhesive AD escapes into the stepped portion 15 along with the positional adjustment, movement of the portion of the adhesive AD toward the through hole 10a of the plate 10 is suppressed by the oblique wall portion 21. Therefore, the adhesive AD that has escaped in the stepped portion 15 can be effectively suppressed from further entering the through hole 10a.

Third Embodiment

Figure 6:
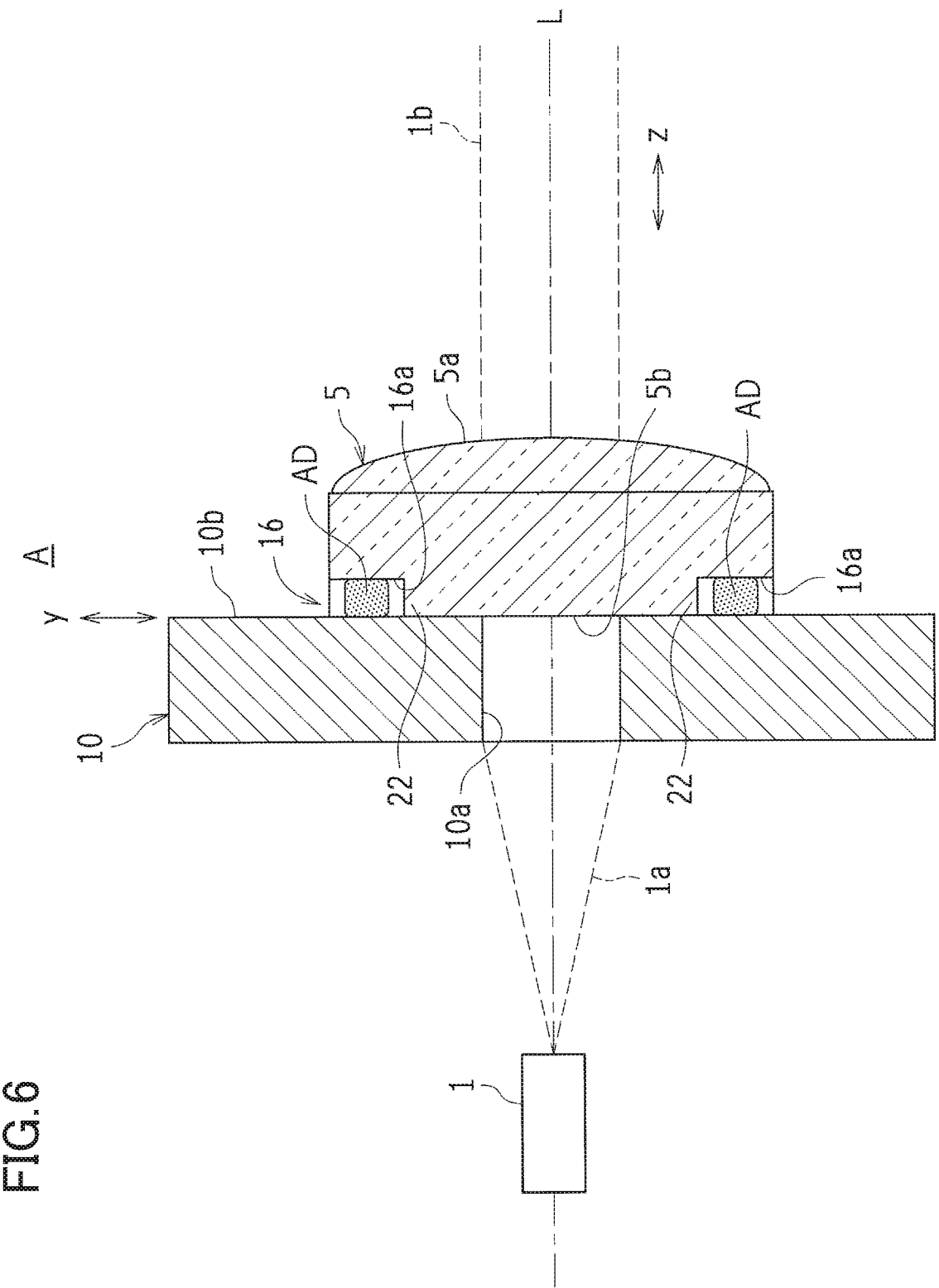
FIG. 6 is a sectional side view illustrating a schematic configuration of a light source module according to a third embodiment.

The third embodiment will now be described. FIG. 6 is a sectional side view illustrating a schematic configuration of the light source module A according to the third embodiment.

In the first embodiment, the stepped portion 15 is formed in the plate 10. However, in the present embodiment, a stepped portion is formed in the convex lens 5. More specifically, in FIG. 6, a stepped portion 16 is formed in the convex lens 5 by cutting out the peripheral edge of the flat surface 5b. The stepped portion 16 has a hollow circular shape when viewed in the z-axis direction and has a quadrangular shape when viewed in cross section.

In the present embodiment, the adhesive AD is applied to the stepped portion 16 of the convex lens 5, and the position of the convex lens 5 in the y-axis direction (or in the x-axis direction) is adjusted in a state where the adhesive AD is interposed between the adjustment surface 10b of the plate 10 and a bottom surface (an end surface on the side on which the optical light-emitting surface 5a is present) 16a of the stepped portion 16 of the convex lens 5. After the position of the convex lens 5 has been adjusted, the convex lens 5 is fixed onto the adjustment surface 10b of the plate 10 with the adhesive AD.

Accordingly, in the present embodiment, since the adhesive AD is applied to the stepped portion 16 formed in the convex lens 5, the adhesive AD is sufficiently suppressed from flowing out onto the flat surface 5b of the convex lens 5 when the position of the convex lens 5 is adjusted, and a portion of the adhesive AD can be effectively suppressed from entering the through hole 10a of the plate 10.

In addition, since the stepped portion 16 is formed at the peripheral edge of the convex lens 5, the application position of the adhesive AD is spaced apart from the through hole 10a. Thus, the adhesive AD can be further suppressed from entering the through hole 10a.

Furthermore, an end portion of the stepped portion 16 that is located on the side on which the through hole 10a is present serves as a wall portion 22 having a protruding shape and extending in the z-axis direction, and thus, similar to the wall portion 20 of the second embodiment, even if a portion of the adhesive AD applied to the inside of the stepped portion 16 moves along with the positional adjustment of the convex lens 5, the wall portion 22 can effectively suppress the adhesive AD from passing through the bonding portion, in which the adjustment surface 10b of the plate 10 and the flat surface 5b of the convex lens 5 are bonded together, and flowing into the through hole 10a.

Fourth Embodiment

Figure 7:
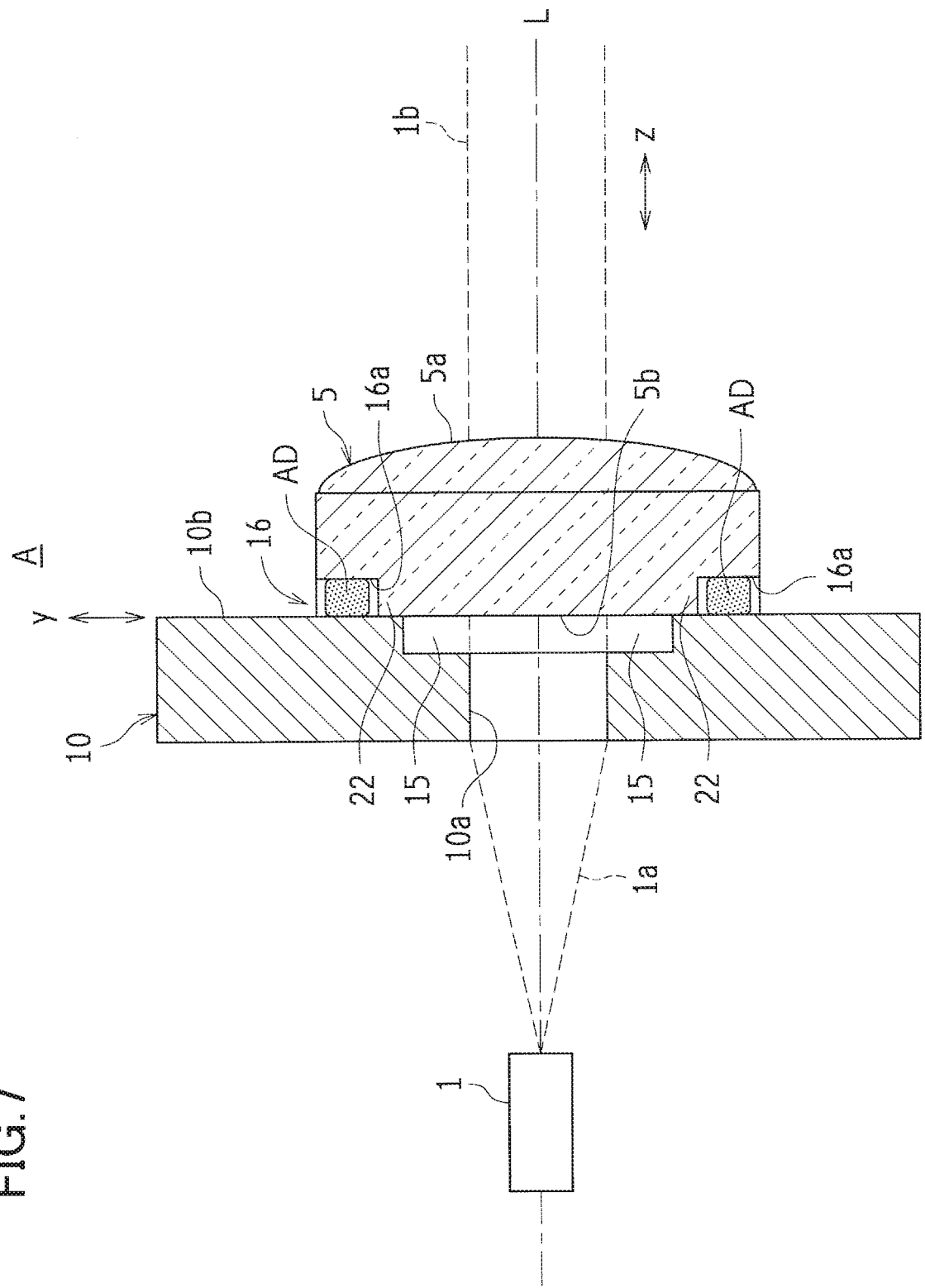
FIG. 7 is a sectional side view illustrating a schematic configuration of a light source module according to a fourth embodiment.

The fourth embodiment will now be described. FIG. 7 is a sectional side view illustrating a schematic configuration of the light source module A according to the fourth embodiment.

In the present embodiment, a stepped portion is formed in both the plate 10 and the convex lens 5. In other words, the light source module A illustrated in FIG. 7 has a structure in which the stepped portion 16 is formed in the convex lens 5 on the side on which the flat surface 5b is present as illustrated in FIG. 6, and in addition, the stepped portion 15 that has been described in the first embodiment is formed in the plate 10. The wall portion 22 of the third embodiment, which has a protruding shape and extends in the z-axis direction as illustrated in FIG. 6, is positioned between the stepped portion 16 of the convex lens 5 and the stepped portion 15 of the plate 10.

Also in the present embodiment, similar to the third embodiment, the adhesive AD is applied to the stepped portion 16 formed in the convex lens 5, and after the position of the convex lens 5 has been adjusted, the convex lens 5 is fixed onto the adjustment surface 10b of the plate 10 with the adhesive AD.

Thus, in the present embodiment, even if a portion of the adhesive AD applied to the inside of the stepped portion 16 of the convex lens 5 moves along with the positional adjustment of the convex lens 5 and flows over the wall portion 22 to the side on which the through hole 10a is present, the adhesive AD escapes into the stepped portion 15 formed in the plate 10, and thus, the adhesive AD can be reliably prevented from entering the through hole 10a. Consequently, the beam shape of the emitted light 1b that has been shaped by the convex lens 5 can be ensured as is expected, and improvement of beam quality can be achieved.

Fifth Embodiment

Figure 8:
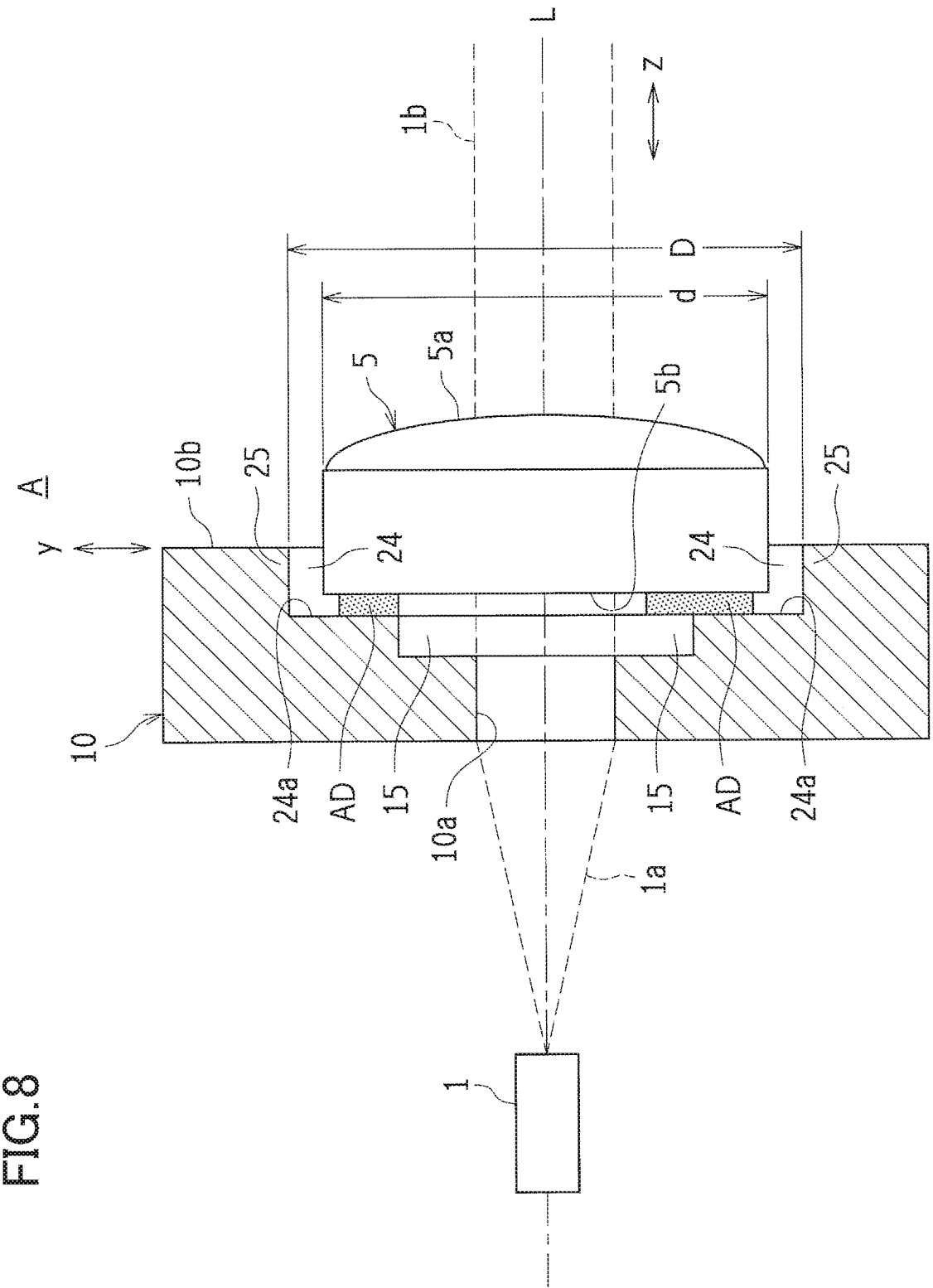
FIG. 8 is a sectional side view illustrating a schematic configuration of a light source module according to a fifth embodiment.

FIG. 8 is a sectional side view illustrating a schematic configuration of a light source module according to the fifth embodiment.

In the present embodiment, a limiting portion that limits the movable range of the convex lens 5 on the adjustment surface 10b when the position of the convex lens 5 is adjusted is provided.

More specifically, in FIG. 8, a recess portion 24 that is recessed toward the semiconductor laser 1 and has a quadrangular shape when viewed in cross section is formed in the adjustment surface 10b of the plate 10. The bottom surface (an end surface on the side on which the semiconductor laser 1 is disposed) 24a of the recess portion 24 is formed in a plane parallel to the adjustment surface 10b of the plate 10. When viewed in the z-axis direction, the recess portion 24 has a circular shape having a diameter D that is longer than a diameter d of the convex lens 5.

When the convex lens 5 is fixed onto the adjustment surface 10b of the plate 10 with the adhesive AD, the adhesive AD is applied to the peripheral edge of the flat surface 5b of the convex lens 5, and in this state, a portion of the convex lens 5 on the side of the flat surface 5b is inserted into the recess portion 24. Then, while the bottom surface 24a of the recess portion 24 serves as an adjustment surface, the position of the convex lens 5 is adjusted in the y-axis direction (or in the x-axis direction) along the bottom surface (adjustment surface) 24a in such a manner that the optical axis of the convex lens 5 coincides with the optical axis L of the semiconductor laser 1.

When this positional adjustment is performed, a surrounding wall 25 that forms the outer peripheral edge of the recess portion 24 serves as a limiting portion that limits the movable range of the convex lens 5 on the adjustment surface 10b. Thus, a distance (D−d) that is the difference between the diameter D of the recess portion 24 and the diameter d of the convex lens 5 is the movable range of the convex lens 5.

The stepped portion 15 is formed in the plate 10 by further cutting out a portion of the recess portion 24 on the side of the through hole 10a toward the semiconductor laser 1. The stepped portion 15 has a circular shape when viewed in the z-axis direction, and an end of the stepped portion 15 on the side of the through hole 10a is formed as an open end that is continuous with the through hole 10a.

In the present embodiment, when the convex lens 5 is fixed onto the adjustment surface 10b of the plate 10, first, the convex lens 5 is inserted into the recess portion 24, and the position of the convex lens 5 is adjusted in the y-axis direction (or in the x-axis direction) along the bottom surface (adjustment surface) 24a of the recess portion 24 while the movable range of the convex lens 5 is limited by the surrounding wall (limiting portion) 25 of the recess portion 24. After the positional adjustment has been performed, the flat surface 5b of the convex lens 5 is fixed onto the bottom surface (adjustment surface) 24a of the recess portion 24 of the plate 10.

Thus, in the present embodiment, by performing positional adjustment of the convex lens 5 along the bottom surface (adjustment surface) 24a of the recess portion 24, improvement in the accuracy of the position of the emitted light 1b that has been shaped by the convex lens 5 can be achieved. In addition, when the positional adjustment is performed, since the movable range of the convex lens 5 can be limited by the limiting portion 25, the movable range of the convex lens 5 on the adjustment surface 24a can be minimized, and the convex lens 5 can be easily fixed onto the plate 10. Furthermore, when the positional adjustment of the convex lens 5 is performed, by causing a portion of the adhesive AD that moves along with the positional adjustment to escape into the stepped portion 15, the adhesive AD can be effectively suppressed from entering the through hole 10a of the plate 10.

Note that, in the present embodiment, although the end of the stepped portion 15 on the side of the through hole 10a is formed as an open end that is continuous with the through hole 10a, the wall portion 20 that has a protruding shape and partitions the stepped portion 15 and the through hole 10a from each other may be provided as described in the second embodiment illustrated in FIG. 4. Alternatively, the oblique wall portion 21, which is illustrated in FIG. 5, may be provided instead of the wall portion 20.

Sixth Embodiment

Figure 9:
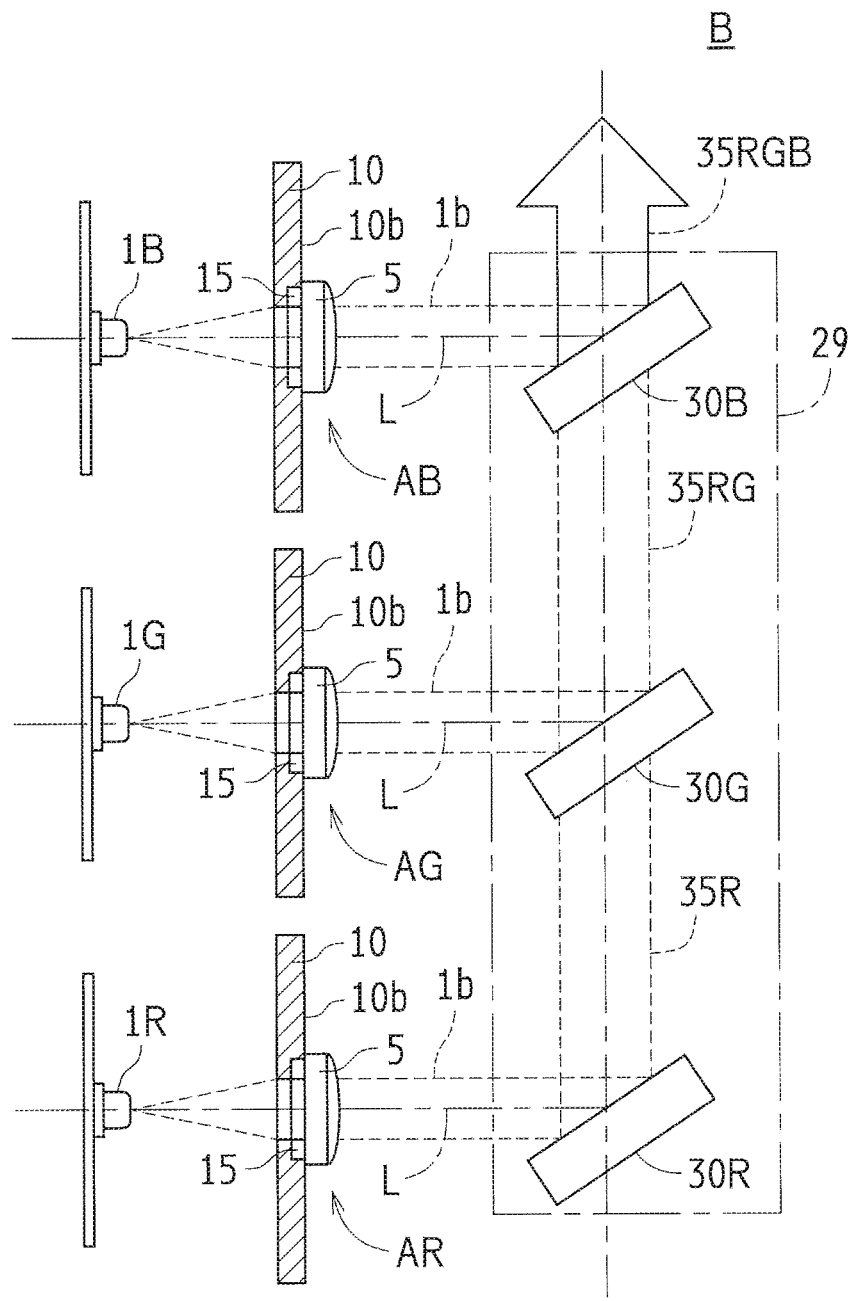
FIG. 9 is a sectional side view illustrating a schematic overall configuration of a light source device according to a sixth embodiment.

FIG. 9 is a diagram illustrating the schematic configuration of a light source device B according to the sixth embodiment.

In FIG. 9, the light source device B includes three light source modules AR, AG, and AB each of which is the same as one of the light source modules A described above. Each of the light source modules AR, AG, and AB can employ any one of the configurations of the first to fifth embodiments. The three light source modules AR, AG, and AB respectively include semiconductor lasers 1R, 1G, and 1B, and the semiconductor lasers 1R, 1G, and 1B respectively emit a red laser beam, a green laser beam, and a blue laser beam. The centers of the emitted light beams 1b from the three light source modules AR, AG, and AB in the x-axis direction and the y-axis direction coincide with the optical axes L of the corresponding semiconductor lasers 1R, 1G, and 1B, which are respectively included in the light source modules AR, AG, and AB, with high accuracy by adjusting the positions of the convex lenses 5 along the adjustment surfaces 10b and 24a of the corresponding plates 10, which are included in the light source modules AR, AG, and AB.

The emitted light beams 1b of the three light source modules AR, AG, and AB are incident on a multiplexer 29. The multiplexer 29 includes three multiplexing prisms 30R, 30G, and 30B that reflect the emitted light beams 1b incident thereon. These multiplexing prisms 30R, 30G, and 30B are arranged so as to be inclined at a predetermined angle (e.g., 45 degrees) with respect to a travelling direction of the emitted light beams 1b. The multiplexing prism 30R reflects the red emitted light 1b of the light source module AR. The multiplexing prism 30G enables a red laser beam 35R that is reflected by the multiplexing prism 30R to pass therethrough. In addition, the multiplexing prism 30G reflects the green emitted light 1b of the light source module AG and combines the red laser beam 35R and the reflected green emitted light 1b on the same axis. The multiplexing prism 30B enables a red-green combined laser beam 35RG combined by the multiplexing prism 30G to pass therethrough. In addition, the multiplexing prism 30B reflects the blue emitted light 1b of the light source module AB and emits a red-green-blue combined laser beam 35RGB that is formed by combining the red-green combined laser beam 35RG and the reflected blue emitted light 1b on the same axis.

The light source device B is included in an image display apparatus, which is not illustrated. The image display apparatus includes a control unit that adjusts the outputs of the three semiconductor lasers 1R, 1G, and 1B or performs on-off-control of the semiconductor lasers 1R, 1G, and 1B on the basis of predetermined image information and, for example, a MEMS mirror device or the like that two-dimensionally scans the emitted light (red-green-blue combined laser beam) 35RGB from the multiplexer 29, and the image display apparatus projects and displays an image that corresponds to the image information onto a screen, which is not illustrated.

In the light source device B of the present embodiment, since the centers of the emitted light beams 1b from the three light source modules AR, AG, and AB, which are included in the light source device B, coincide with the optical axes L of the corresponding semiconductor lasers 1R, 1G, and 1B with high accuracy, the multiplexer 29 can combine the red emitted light, the green emitted light, and the blue emitted light from the red, green, and blue semiconductor lasers 1R, 1G, and 1B on the same axis with high accuracy and can emit the single red-green-blue combined laser beam 35RGB.

OTHER EMBODIMENTS

In the above description, although the convex lens 5 is disposed on the side of the plate 10 that is opposite to the side of the plate 10 on which the semiconductor laser 1 is disposed, the convex lens 5 may disposed on the same side on which the semiconductor laser 1 is disposed. In this case, light that has been emitted from the semiconductor laser 1 and that has passed through the convex lens 5 passes through the through hole 10a of the plate 10 and is output to the outside. Thus, a surface of the plate 10 on the same side on which the semiconductor laser 1 is disposed is formed as an adjustment surface having a plane defined by the two axes, which are the x-axis direction and the y-axis direction, and the position of the convex lens 5 is adjusted along this adjustment surface.

In addition, although the convex lens 5 is used in the above-description, a concave lens or another lens may be used.

The present invention can be implemented in various other forms without departing from the spirit or main features of the present invention. Therefore, the above-described embodiments are merely examples and should not be interpreted in a limited manner. All modifications and changes belonging to a range equivalent to the claims of the present invention are within the scope of the present invention.

INDUSTRIAL APPLICABILITY

The present invention is applicable to and useful in a light source module and a light source device because, in a light source module that uses a semiconductor laser, the position of a lens in a direction perpendicular to the optical axis of the semiconductor laser is adjustable along an adjustment surface of a plate, and in addition, an adhesive that is used for bonding the lens to the plate can be effectively suppressed from entering the effective aperture of the lens, so that improvement of beam quality can be achieved.

REFERENCE SIGNS LIST

A, AR, AG, AB light source module
1, 1R, 1G, 1B semiconductor laser
1b emitted light
L optical axis
5 convex lens (lens)
5a optical light-emitting surface
5b flat surface (end surface opposite to optical light-emitting surface)
10 plate
10a, 10a' through hole
10b, 24a adjustment surface
13 bonding portion
AD adhesive
15, 15', 16 stepped portion
20, 21, 22 wall portion
25 limiting portion
29 multiplexer
B light source device

The invention claimed is:

1. A light source module comprising:
a semiconductor laser;
a lens that shapes emitted light of the semiconductor laser; and
a plate on which the lens is disposed,
wherein the plate has a through hole through which the emitted light of the semiconductor laser passes and a flat surface as an adjustment surface that is used for adjusting a position of the lens with respect to the through hole in a direction perpendicular to an optical axis of the semiconductor laser,
wherein an end surface of the lens that is opposite to an optical light-emitting surface of the lens is fixed to the adjustment surface of the plate with an adhesive,
wherein a stepped portion that is recessed in a direction of the optical axis of the semiconductor laser is formed in a bonding portion in which the end surface of the lens and the adjustment surface are bonded together, and
wherein the stepped portion is formed outside an outer periphery of the through hole.

2. The light source module according to claim 1, wherein the stepped portion is formed in the plate.

3. The light source module according to claim 1, wherein the stepped portion is formed in the lens.

4. The light source module according to claim 1, wherein the stepped portion is formed in such a manner as to surround the outer periphery of the through hole.

5. The light source module according to claim 4, wherein the through hole has a circular shape or an elliptical shape when viewed in the direction of the optical axis.

6. The light source module according to claim 1, wherein a wall portion that extends in the direction of the optical axis is formed at an end of the stepped portion, the end being located on a side on which the through hole is present.

7. The light source module according to claim 6, wherein the wall portion has a protruding shape or has an oblique shape when viewed in cross section.

8. The light source module according to claim 1, wherein the plate includes a limiting portion that limits a movable range of the lens in the direction perpendicular to the optical axis.

9. A light source device comprising:
a plurality of the light source modules according to claim 1; and
a multiplexer that combines emitted light beams from the plurality of light source modules.

* * * * *